US011521862B2

(12) United States Patent
Hu et al.

(10) Patent No.: US 11,521,862 B2
(45) Date of Patent: Dec. 6, 2022

(54) PROCESS FOR FABRICATING CIRCUIT COMPONENTS IN MATRIX BATCHES

(71) Applicant: Chih-liang Hu, Taipei (TW)

(72) Inventors: Chih-liang Hu, Taipei (TW); Che-kai Hu, Taipei (TW)

(73) Assignee: Chih-Liang Hu, Taipei (TW)

( * ) Notice: Subject to any disclaimer, the term of this patent is extended or adjusted under 35 U.S.C. 154(b) by 1027 days.

(21) Appl. No.: 16/220,868

(22) Filed: Dec. 14, 2018

(65) Prior Publication Data
US 2019/0187287 A1 Jun. 20, 2019

(30) Foreign Application Priority Data

Dec. 15, 2017 (TW) ................................ 106144125
Dec. 15, 2017 (TW) ................................ 106144126

(51) Int. Cl.
*H01L 21/48* (2006.01)
*G01S 7/481* (2006.01)
(Continued)

(52) U.S. Cl.
CPC ........ *H01L 21/4832* (2013.01); *G01S 7/4813* (2013.01); *G01S 7/4817* (2013.01);
(Continued)

(58) Field of Classification Search
None
See application file for complete search history.

(56) References Cited

U.S. PATENT DOCUMENTS

2004/0099940 A1* 5/2004 Standing ................. H01L 24/37
257/E23.044
2005/0253258 A1* 11/2005 Steers .................... H05K 3/341
257/734
(Continued)

FOREIGN PATENT DOCUMENTS

CN        204946889 U  *  1/2016  ... H01L 2224/37147
KR        20160074494     *  6/2016  ............ H01L 24/75

OTHER PUBLICATIONS

First Office Action Application No. 201811532954.1, pp. 4-6 (Year: 2018).*

*Primary Examiner* — Alexander G Ghyka
(74) *Attorney, Agent, or Firm* — ArentFox Schiff LLP

(57) ABSTRACT

A process for batch fabrication of circuit components is disclosed via simultaneously packaging multiple circuit component dice in a matrix. Each die has electrodes on its tops and bottom surfaces to be electrically connected to a corresponding electrical terminal of the circuit component it's packaged in. For each circuit component in the matrix, the process forms preparative electrical terminals on a copper substrate. Component dice are pick-and-placed onto the copper substrate with their bottom electrodes landing on corresponding preparative electrical terminal. Horizontal conductor plates are then placed horizontally on top of the circuit component dice, with bottom surface at one end of each plate landing on the dice's top electrode. An opening is formed at the opposite end and has vertical conductive surfaces. A vertical conductor block is placed into the opening and lands on the preparative electrical terminal, and the opening's vertical conductive surfaces facing the top end side surface of the vertical block. A thermal reflow then simultaneously melts pre-applied soldering material so that each circuit component die and its vertical conductor block (Continued)

are soldered to the copper substrate below and its horizontal conductor plate above.

18 Claims, 9 Drawing Sheets

(51) Int. Cl.
  *H01L 21/56* (2006.01)
  *H05K 3/34* (2006.01)
  *H01L 23/00* (2006.01)
  *H01L 29/74* (2006.01)
  *H05K 13/04* (2006.01)
  *H01L 23/495* (2006.01)
  *H01L 21/60* (2006.01)

(52) U.S. Cl.
  CPC .......... *H01L 21/4875* (2013.01); *H01L 21/56* (2013.01); *H01L 21/561* (2013.01); *H01L 21/60* (2021.08); *H01L 23/49582* (2013.01); *H01L 24/40* (2013.01); *H01L 24/80* (2013.01); *H01L 24/83* (2013.01); *H01L 24/84* (2013.01); *H01L 24/95* (2013.01); *H01L 24/97* (2013.01); *H01L 29/74* (2013.01); *H05K 3/34* (2013.01); *H05K 13/0404* (2013.01); *H01L 24/29* (2013.01); *H01L 24/32* (2013.01); *H01L 24/33* (2013.01); *H01L 2021/60015* (2013.01); *H01L 2224/29311* (2013.01); *H01L 2224/32245* (2013.01); *H01L 2224/33181* (2013.01); *H01L 2224/40101* (2013.01); *H01L 2224/40245* (2013.01); *H01L 2224/40996* (2013.01); *H01L 2224/83101* (2013.01); *H01L 2224/83191* (2013.01); *H01L 2224/83192* (2013.01); *H01L 2224/83815* (2013.01); *H01L 2224/84345* (2013.01); *H01L 2224/84815* (2013.01); *H01L 2224/951* (2013.01); *H01L 2924/1203* (2013.01); *H01L 2924/1301* (2013.01); *H01L 2924/1304* (2013.01); *H01L 2924/14* (2013.01); *H01L 2924/15747* (2013.01)

(56) References Cited

U.S. PATENT DOCUMENTS

| | | | | |
|---|---|---|---|---|
| 2008/0227294 | A1* | 9/2008 | Suh | C25D 13/04 |
| | | | | 438/687 |
| 2009/0315061 | A1* | 12/2009 | Andrews | H01L 33/48 |
| | | | | 438/26 |
| 2011/0247852 | A1* | 10/2011 | Simion | H01L 24/743 |
| | | | | 174/17.05 |
| 2013/0183862 | A1* | 7/2013 | Ni | H01R 12/71 |
| | | | | 29/831 |
| 2016/0126197 | A1* | 5/2016 | Matoy | H01L 23/49562 |
| | | | | 257/773 |
| 2017/0287729 | A1* | 10/2017 | Hu | H01L 23/049 |
| 2020/0006276 | A1* | 1/2020 | Chen | H01L 25/105 |

* cited by examiner

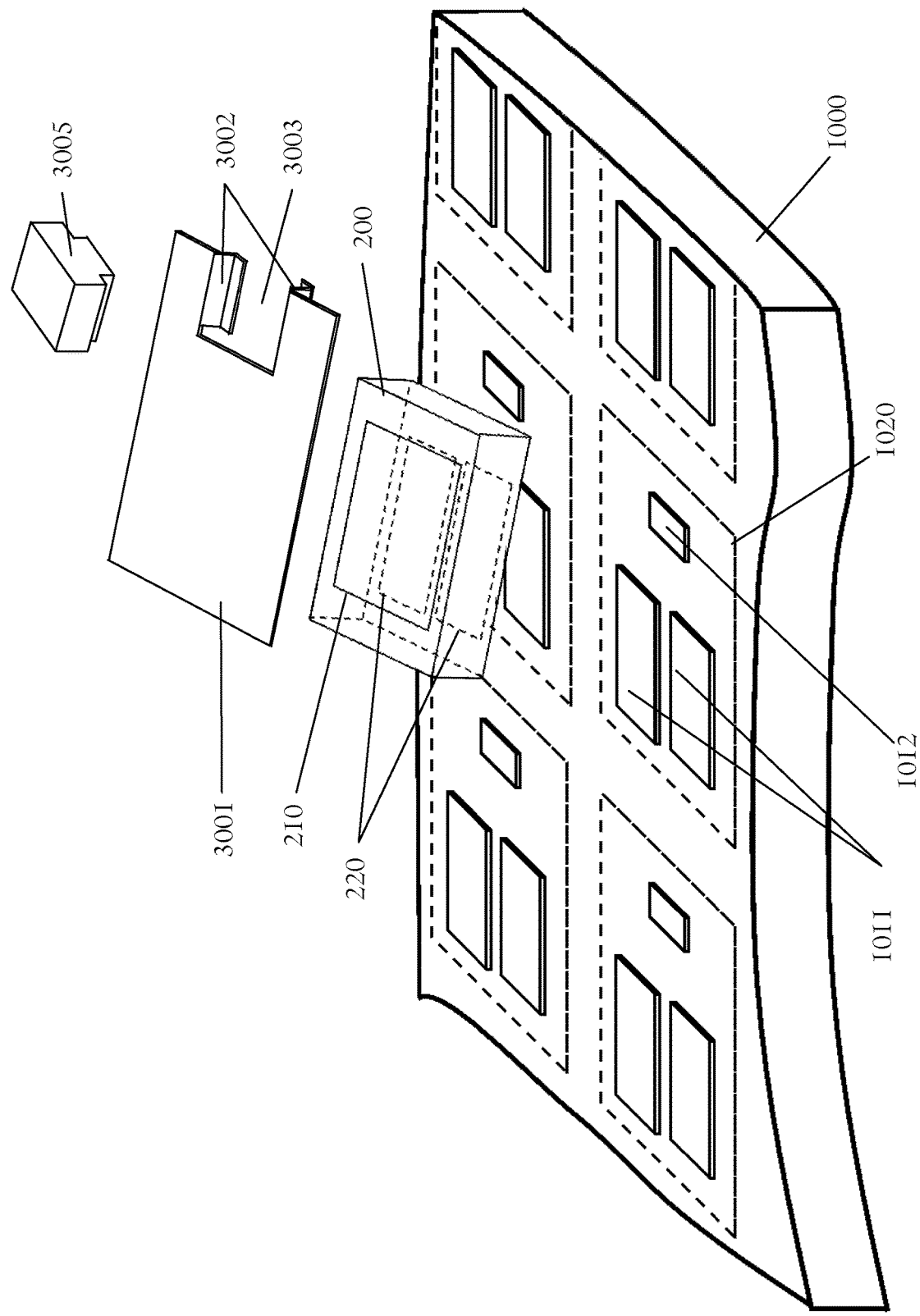

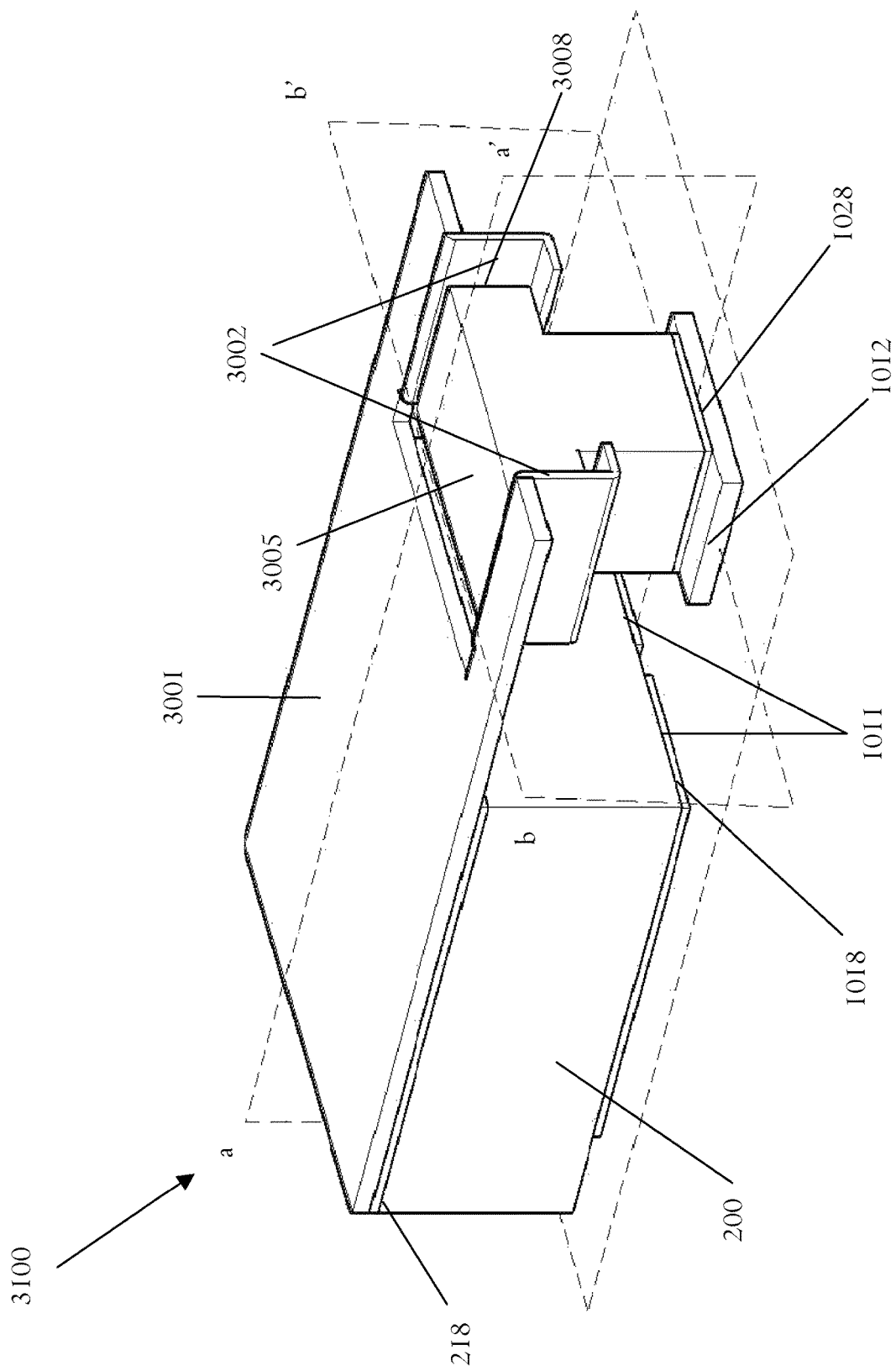

PROCESS FOR FABRICATING CIRCUIT COMPONENTS IN MATRIX BATCHES

CROSS REFERENCE TO RELATED APPLICATION

This application claims the benefit of priority to Taiwan Patent Application Nos. 106144125 and 106144126, filed Dec. 15, 2017. The disclosure of the prior applications is hereby incorporated in its entirety by reference.

BACKGROUND

Field of the Invention

The present invention relates to a process for the fabrication of circuit components and in particular to a process for such fabrication in matrix batches for efficiency and cost. More particularly, the present invention relates to a process for the fabrication of circuit components optimized for power rating due to much improved current capacity and heat dissipation.

Description of the Related Art

High-power circuit components like power diode, power transistor and thyristor are indispensable discrete circuit components in power electronics applications. Their performance, reliability and durability characteristics, among others, are critical to important applications such as in the renewable energy and electric vehicles industries. But besides technical characteristics, production costs of these power components is equally important a factor for their widespread commercial use.

Various surface mount packages of existing discrete circuit components such as diodes, light-emitting diodes, transistors and thyristors are commonly available in forms including cylindrical glass/plastic, lead-frame leaded, quad flat-pack leadless and flip-chip packages, among others. Of them, flip-chip package, although featuring the advantage of being small, light and slim, is rarely used in durable large-power applications due to issues of their costly fabrication, application inconvenience and premature aging. Packaging other than flip-chip, by contrast, are considered mainstream in the market. However, as demands for ever more improvements in ever more technology applications grow, existing packaging technology for circuit components, in particular, surface mount power devices has been falling short of many aspects of technical requirements. For example, larger-power components needs good thermal management design to deliver their high-rating performance, yet existing technology has bottlenecks.

Various solutions can be found to provide packaging for circuit components with good heat dissipation and high power. For example, techniques proposed in Taiwan Patent No. 1583282 and Taiwan Patent Application No. 105110137 are based on the use of two large conductive copper plates. They describe methods for the simultaneously packaging of multiple circuit component dice in a matrix-based fabrication procedure aiming for efficient mass production batches to reduce unit cost.

However, for such techniques based on the use of two large copper plates, tolerances in the dimensioning of their matrix-bearing copper plate substrates, circuit component die bodies, parallelism between their plates, alignment among all parts in the matrix, and thickness of soldering material deployed, all need to be controlled within certain precision ranges. Margin of error for their controlled fabrication parameters is small. Though not impossible, but their precision management and control means elevated cost levels. Poor control easily leads to quality problems to substantially elevate overall costs, obviously due to poor production yield rate.

SUMMARY OF THE INVENTION

It is therefore an object of the present invention to provide a process for fabricating circuit components in matrix batches with high efficiency and at low cost.

It is also an object of the present invention to provide a process for fabricating circuit components in matrix batches that provide high power rating due to high current capacity and high heat dissipation.

In order to achieve the above and other objects the present invention provides a process for batch fabrication of circuit components that simultaneously packages multiple circuit component dice in a matrix. Each die having at least two electrodes with one on a top surface and the others on a bottom surface, and each die electrode is electrically connected to a corresponding electrical terminal of the circuit component it is packaged in. The process includes the following steps for each circuit component in the matrix. First, a preparative electrical terminal is formed on a copper substrate for each of the corresponding electrodes of its die. Then, a circuit component die is pick-and-placed onto the copper substrate so that each electrode on the die bottom surface lands on its corresponding preparative electrical terminal. Then, a horizontal conductor plate is pick-and-placed horizontally on top of the circuit component die so that a bottom surface of one end of the horizontal conductor plate lands on the top electrode of the die, The horizontal conductor plate has an opening at the end opposite where it lands on the die, and the opening has at least one vertical conductive surface. Next, a vertical conductor block is pick-and-placed into the opening of the horizontal conductor plate so that a bottom surface of the vertical conductor block lands on the preparative electrical terminal for the top electrode of the die, with the at least one vertical conductive surface of the opening faces the top end side surface of the vertical conductor block. Finally, for all circuit components in the matrix, a thermal reflow is performed to simultaneously melts a soldering material pre-applied to the surface of each preparative electrical terminal of the copper substrate, the surface of the top electrode of the die, and the vertical conductive surface of the opening in the horizontal conductor plate. This is so that the circuit component die and the vertical conductor block are soldered to the copper substrate below and the horizontal conductor plate above.

The present invention also provides the above process wherein the opening in the horizontal conductor plate has a full circumference.

The present invention may also provides the process wherein the opening in the horizontal conductor plate has incomplete circumference.

The present invention also provides a process for batch fabrication of circuit components that simultaneously packages multiple circuit component dice in a matrix. Each die having at least two electrodes with one on a top surface and the others on a bottom surface, and each die electrode is electrically connected to a corresponding electrical terminal of the circuit component it is packaged in. The process includes the following steps for each circuit component in the matrix. First, a preparative electrical terminal is formed on a copper substrate for each of the corresponding electrodes of its die. Then, a circuit component die is pick-and-placed onto the copper substrate so that each electrode on the die bottom surface lands on its corresponding preparative electrical terminal. Then, a vertical conductor block is pick-and-placed so that a bottom surface of the vertical conductor block lands on the preparative electrical terminal for the top electrode of the die. Next, a horizontal conductor plate is pick-and-placed horizontally on top of the circuit component die and the vertical conductor block so that a bottom surface of one end of the horizontal conductor plate lands on the top electrode of the die, and a bottom surface of the other end of the horizontal conductor plates lands on a top surface of the vertical conductor block. Finally, for all circuit components in the matrix, a thermal reflow is performed to simultaneously melts a soldering material pre-applied to the surface of each preparative electrical terminal of the copper substrate, the surface of the top electrode of the die, and the top surface of the vertical conductor block, so that the circuit component die and the vertical conductor block are soldered to the copper substrate below and the horizontal conductor plate above.

The present invention also provides the above process that further performs a nickel-gold or nickel-tin plating to the surface of each and every electrical terminal after the subtractive processing.

The present invention may also provides the process wherein the circuit component is a discrete circuit component having two, three or more electrical terminals.

The present invention may also provides the process wherein the circuit component is a diode.

The present invention may also provides the process wherein the circuit component is a transistor.

The present invention may also provides the process wherein the circuit component is an optical coupler switch.

The present invention may also provides the process wherein the circuit component is an integrated circuit component having at least four electrical terminals.

BRIEF DESCRIPTION OF THE DRAWINGS

FIG. 3A schematically illustrates the sequential pick-and-placing of parts onto the copper substrate for the fabrication of a circuit component according to an embodiment of the present invention;

FIG. 3B is a perspective view of the construction of one unit of circuit component after completing the pick-and-placing sequence depicted in FIG. 3A and a subsequent thermal reflow procedure;

DETAILED DESCRIPTION

Figure 1:
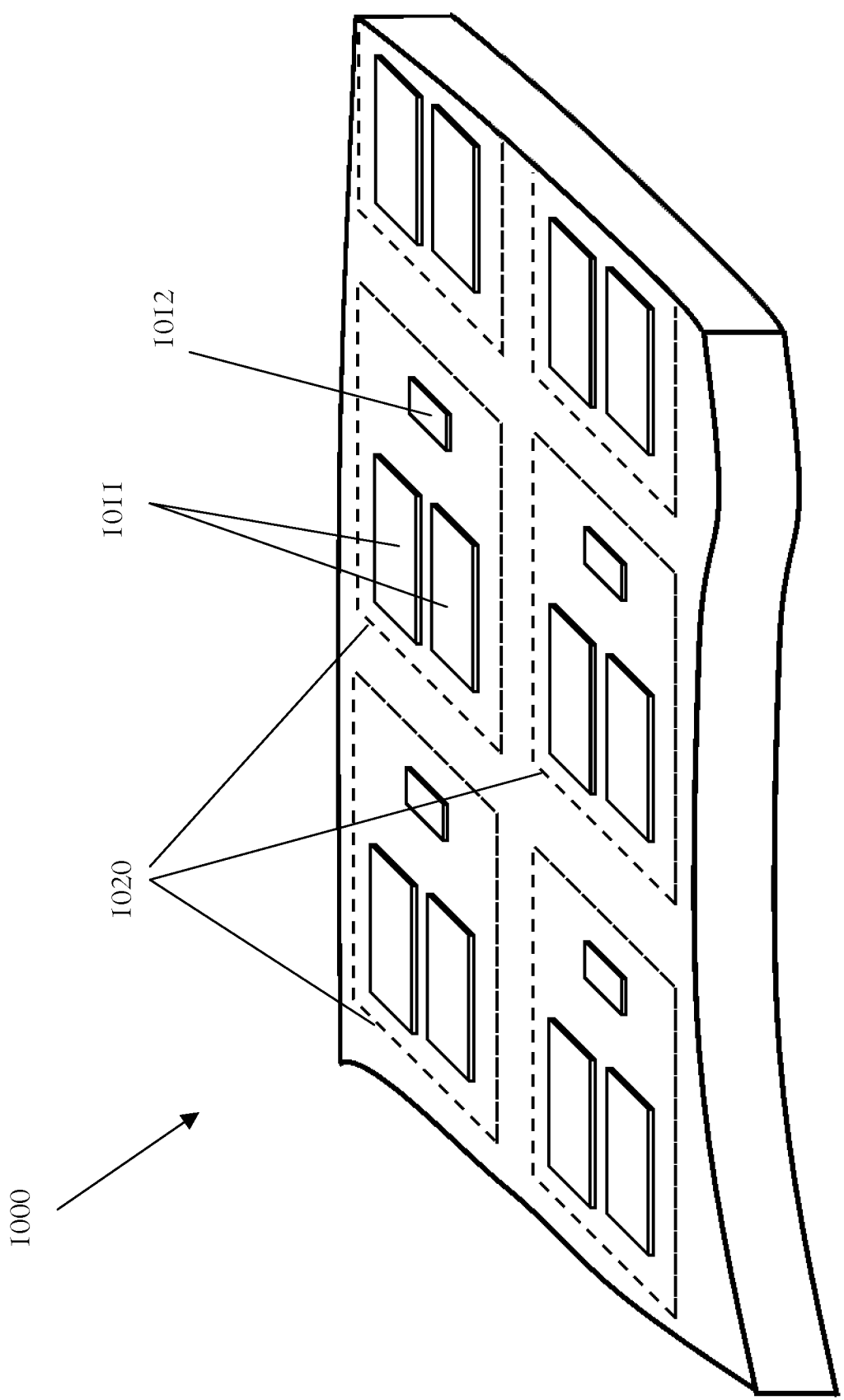
FIG. 1 schematically shows a partial region of a copper substrate for the matrix-based fabrication of a circuit component having three electrical terminals according to an embodiment of the present invention.

FIG. 1 schematically shows a partial region of a copper substrate for the matrix-based fabrication of a circuit component having three electrical terminals according to an embodiment of the present invention. A typical batch fabrication according to the present invention uses a matrix of circuit components numbered in quantities of a few tens by a few tens units, although FIG. 1 only shows four. Each of the circuit component units is identified by dotted-line frames denoted by reference numeral 1020. In this depicted embodiment, preparative electrical terminals 1011 and 1012 for the bottom and top electrodes respectively of the circuit component die (not shown in FIG. 1) are formed over the surface of the copper substrate 1000.

In the embodiment in FIG. 1, these preparative terminals protruding above the upper surface of the copper substrate 1000 may be formed by, for example, an etching-based subtractive procedure, an electroplating/chemical reaction-based additive procedure, or a common mechanical procedure such as lathing, milling, drilling, grinding, sawing and stamping etc. on the top surface of the basic copper substrate 1000. These preparative terminals 1011 and 1012 for multiple circuit component units 1020 can be prepared in batch. In an alternative, any of the preparative terminals may not protrude above the upper surface of the substrate 1000.

Figure 2:
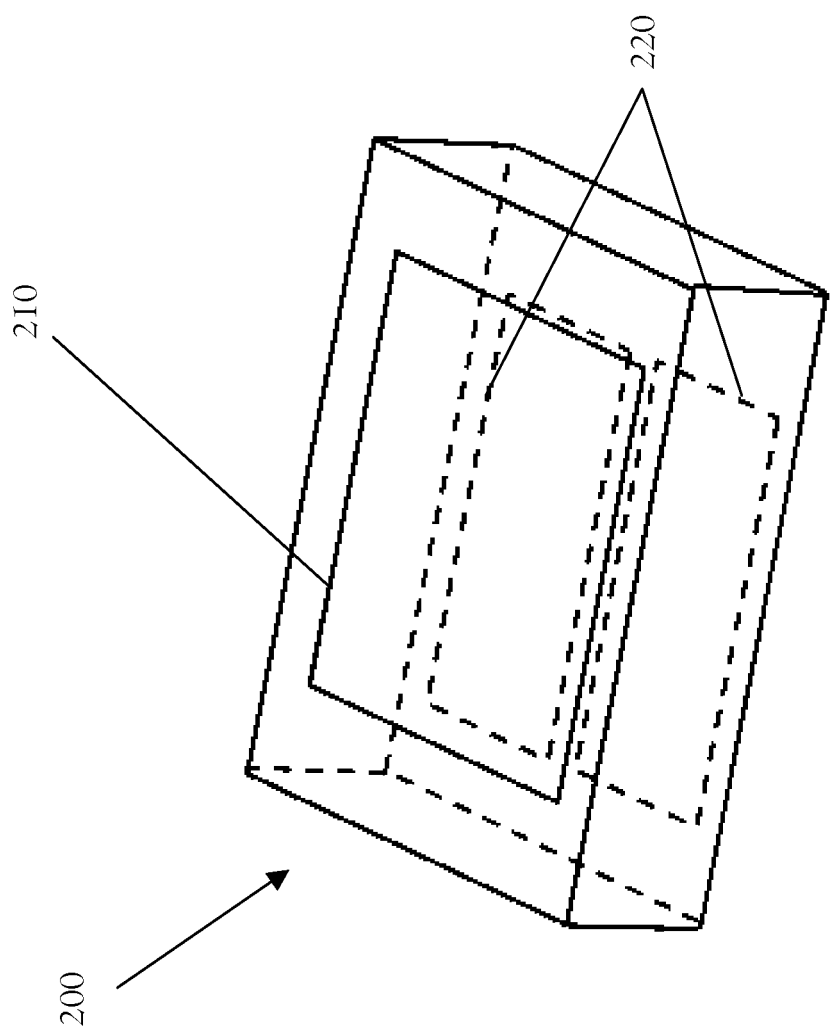
FIG. 2 schematically shows a perspective view of the basic body structure of a circuit component die to be packaged into a circuit component applicable to the copper substrate of FIG. 1.

FIG. 2 schematically shows a perspective view of the basic body structure of a circuit component die to be packaged into a circuit component applicable to the copper substrate of FIG. 1. In general, a circuit component die 200 such as depicted for a typical power diode, transistor or thyristor has a rectangular body structure. According to the present invention, each of an entire batch of such dice 200 is individually pick-and-placed on position within its corresponding circuit component unit 1020 on the surface of the copper substrate 1000 (see FIGS. 1, and 3). With reference to FIGS. I and 2, when the component die 200 is placed correctly in its assigned unit 1020, each of its two bottom electrodes 220 is correspondingly aligned and lands on the preparative electrical terminal 1011 on the surface of copper substrate 1000.

FIG. 3A schematically illustrates the sequential pick-and-placing of parts onto the copper substrate for the fabrication of a circuit component according to an embodiment of the present invention. The pick-and-place operation includes first pick-and-placing the component die 200 to its assigned as described.

Then, a horizontal conductor plate 3001 is pick-and-placed subsequently, such that the bottom surface at one end (to the left in FIG. 3) of the horizontal conductor plate 3001 lands on and aligns with the top electrode 210 of the component die 200.

Next, a vertical conductor block 3005 is pick-and-placed into the opening 3003 of the horizontal conductor plate 3001. Bottom surface of the vertical conductor block 3005 lands on the preparative electrical terminal 1012 for the top electrode 210 of the die 200. The vertical conductive surfaces 3002 of the opening 3003 facing the top end side surface of the vertical conductor block 3005.

It should be noted that the opening 3003 for the vertical conductor block 3005 may be a hole opened up at the right end of the horizontal conductor plate 3001 with a complete circumference. This means the opening 3003 is formed within the edge of the plate 3001. Or, the opening 3003 may be one with an incomplete circumference, meaning that the it is opened on the edge of the plate 3001, as is the case shown in the drawing.

Next, for all circuit components 200 in the matrix already positioned on the copper substrate 1000, a thermal reflow can then be performed. This melts soldering material, typically in the form of solder paste pre-applied to the surface of each preparative electrical terminal 1011 and 1012 in the entire matrix on the copper substrate 1000, the surface of the top electrode 210 of the die 200, and the vertical conductive surfaces 3002 of the opening 3003 in the horizontal conductor plate 3001. When the soldering material solidifies out of the reflow, the circuit component die 200 and the vertical conductor block 3005 are soldered firmly to the copper substrate 1000 below and the horizontal conductor plate 3001 above.

The soldering material can be typical solder paste containing tin particles, or soldering bars/plates containing tin. The soldering material can be appropriately dispensed in between the pick-and-place operational steps of the component die 200, the horizontal conductor plate 3001, and the vertical conductor block 3005. If, for example, solder paste is used, automatic solder paste dispensing equipment can be used. If, alternatively, solder plates are used, pick-and-place equipment can be used.

FIG. 3B is a perspective view of the construction of one unit of circuit component after completing the pick-and-placing sequence depicted in FIG. 3A and a subsequent thermal reflow procedure. At this stage, all parts for each component unit including the die 200, the vertical conductor block 3005 and the horizontal conductor plate 3001 would have been firmly soldered and secured onto the copper substrate 1000.

As is shown in FIG. 3B, at this point in time, the soldering material present between the bottom electrodes 220 (FIG. 3A) of the component die 200 and the surface of the corresponding preparative electrical terminal 1011 on the copper substrate 1000 becomes a solidified bonding solder layer 1018. The soldering material dispensed between the bottom surface of the horizontal conductor plate 3001 and the corresponding top electrode 210 of the die 200 becomes solidified bonding solder layer 218. The soldering material pre-applied between the vertical conductive surfaces 3002 in the opening 3003 of the horizontal conductor plate 3001 and their corresponding side surfaces on the top end of the vertical conductor block 3005 becomes solidified bonding solder layer 3008. And, the soldering material pre-applied between the bottom surface of the vertical conductor block 3005 that lands on the surface of the corresponding preparative electrical terminal 1012 of the copper substrate 1000 becomes solidified bonding solder layer 1028.

According to another embodiment of the present invention, the sequences of the pick-and-placing steps performed for the horizontal conductor plate and the vertical conductor block can be swapped. In this case as is described in FIG. 4, the opening 3003 (see FIG. 3A) formed on the horizontal conductor plate 3001 is not needed. In other words, while in the embodiment described in FIGS. 3A and 3B where the horizontal conductor plate 3001 is pick-and-placed first and then and the vertical conductor block 3005 is then placed in the opening 3003, in the alternative approach for FIG. 4, the vertical conductor block 3005A is placed first followed by the placing of the horizontal conductor plate 3001A.

Figure 4:
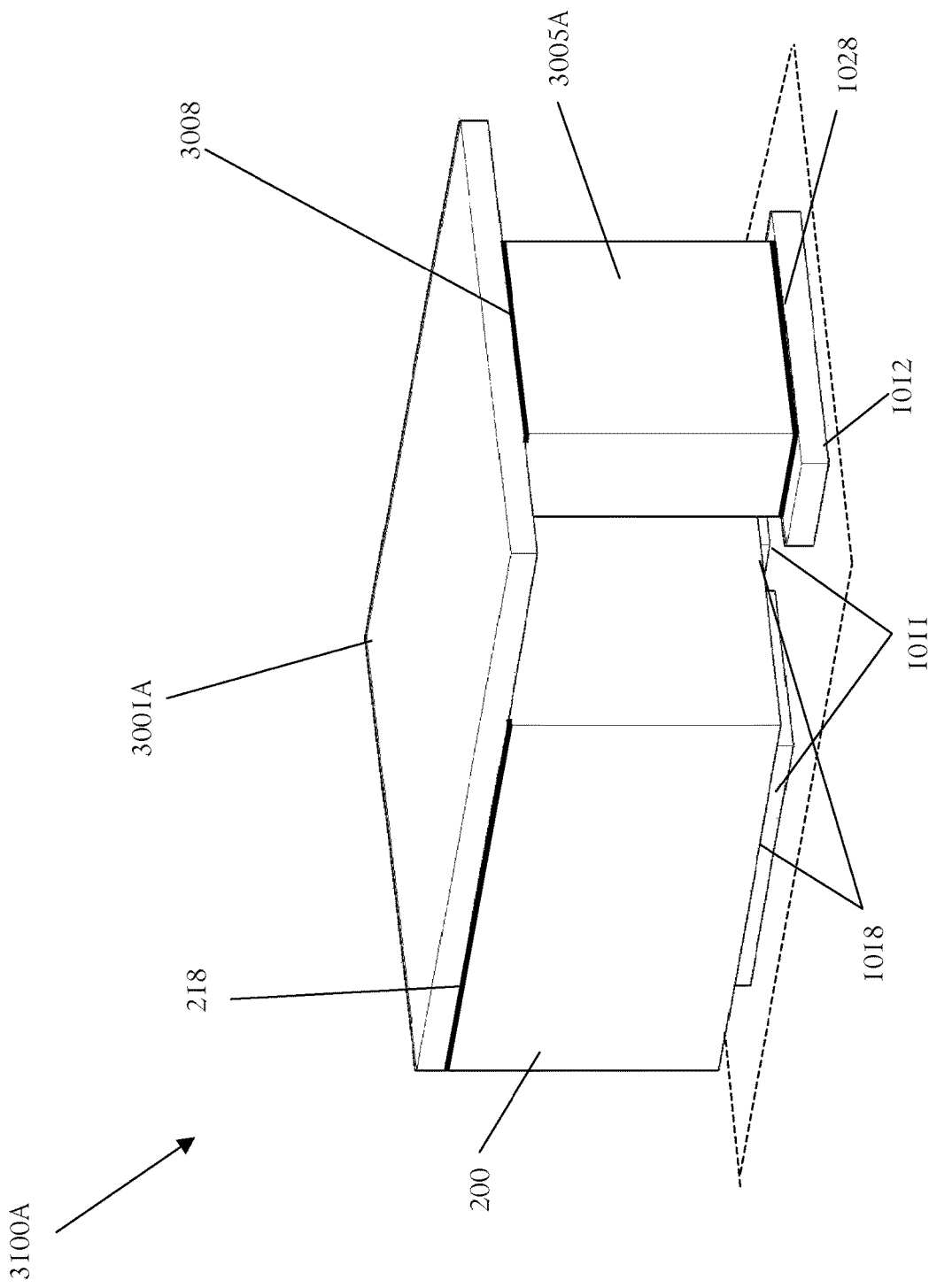
FIG. 4 is a perspective view of one unit of circuit component similar to that of FIG. 3B after concluding its parts pick-and-placing procedures and a subsequent thermal reflow procedure.

FIG. 4 is a perspective view of one unit of circuit component similar to that of FIG. 3B after concluding its parts pick-and-placing procedures and a subsequent thermal reflow procedure. In this embodiment, the structure of a circuit component unit, shown as 3100A, is constructed in the following procedure.

First, a circuit component die 200 is pick-and-placed onto its proper position on the copper substrate (not shown in FIG. 4), such that each of its bottom electrodes (220 in FIG. 2) lands on a preparative electrical terminal 1011.

Then, a vertical conductor block 3005A is pick-and-placed. Bottom surface of the block 3005A lands on its corresponding preparative electrical terminal 1012 that forms on the surface of the copper substrate (1000, not shown).

Next, a horizontal conductor plate 3001A is pick-and-placed subsequently. Bottom surface to one end of the horizontal conductor plate 3001A contacts and is in alignment with the top electrode 210 of the component die 200, and bottom surface to the other end of the plate 3001A contacts and is in alignment with the top surface of the vertical conductor block 3005A.

After the pick-and-place operation performed for the component die 200, the vertical conductor block 3005A and the horizontal conductor plate 3001A is complete, a thermal reflow procedure can be performed. The reflow procedure can simultaneously melt the soldering material pre-applied to the surface of each preparative electrical terminal, 1011 and 1012, on the copper substrate, the surface of the top electrode of the die 200, and the top surface of the vertical conductor block 3005A, so that the circuit component die 200 and the vertical conductor block 3005A are soldered to the copper substrate 1000 below and the horizontal conductor plate 3001A above.

As shown in FIG. 4, at this point in time, the soldering material pre-applied between the bottom electrodes 220 of the die 200 and the surface of their corresponding ones of the preparative electrical terminals 1011 and 1012 of the substrate 1000 is melted and then solidifies to become the solder layer 1018. Similarly, the soldering material pre-applied between the bottom surface at one end of the horizontal conductor plate 3001A and its corresponding top electrode 210 of the circuit component die 200 solidifies and becomes a solder layer 218. Further, the soldering material pre-applied between the top surface of the vertical conductor block 3005A and its corresponding bottom surface of the horizontal conductor plate 3001A at the end opposite where the die 200 is solidifies and becomes the solder layer 3008. And, the soldering material pre-applied between the bottom surface of the vertical conductor block 3005A and the surface of its corresponding preparative electrical terminal 1012 of the copper substrate 1000 solidifies and becomes the solder layer 1028.

Fabrication process technology for circuit components implementing matrix-based batch production in accordance with the example of the component structural unit construction 3100 of FIG. 3B of the present invention is commercially competitive because of its forgiving larger processing tolerances. This makes the fabrication tolerable to circuit component dice having relatively larger dimensional discrepancies in the batch of dice thrown into a matrix. As a comparison, the structural unit 3100A shown in FIG. 4 and the corresponding fabrication process thereof are suitable for situations where one entire batch of component dice requires a relatively tighter dimensional tolerance.

Comparing the two, although both the horizontal conductor plates and the vertical conductor blocks have slightly different structural constructions, which calls for a swapped pair of sequence steps for the pick-and-place operation, both structural units feature essentially the same optimized construction that supports high power rating. Both feature a large-current circuit within their respective constructions that is supported by a large circuit conductor cross-sectional surface area. The reason for such low electrical resistivity is obvious: The use of a bulky block of vertical conductor (3005, 3005A) that is connected to the component die via a flat and wide horizontal conductor plate (3001, 3001A). Such constructions ensures both large current and large heat dissipation capacities simultaneously that are key to high power rating.

Further, the four soldering surfaces of the unit structural construction of the circuit components depicted in FIGS. 3A and 4 of the present invention, together allow the soldering material to serve as a means that acts as an overall system balancing mechanism throughout the process of thermal reflow when the soldering material is in its molten state. This results in a significantly improved production yield rate for the efficient matrix-based batch fabrication. Such improvement leads directly to lowered production costs.

Figure 5A:
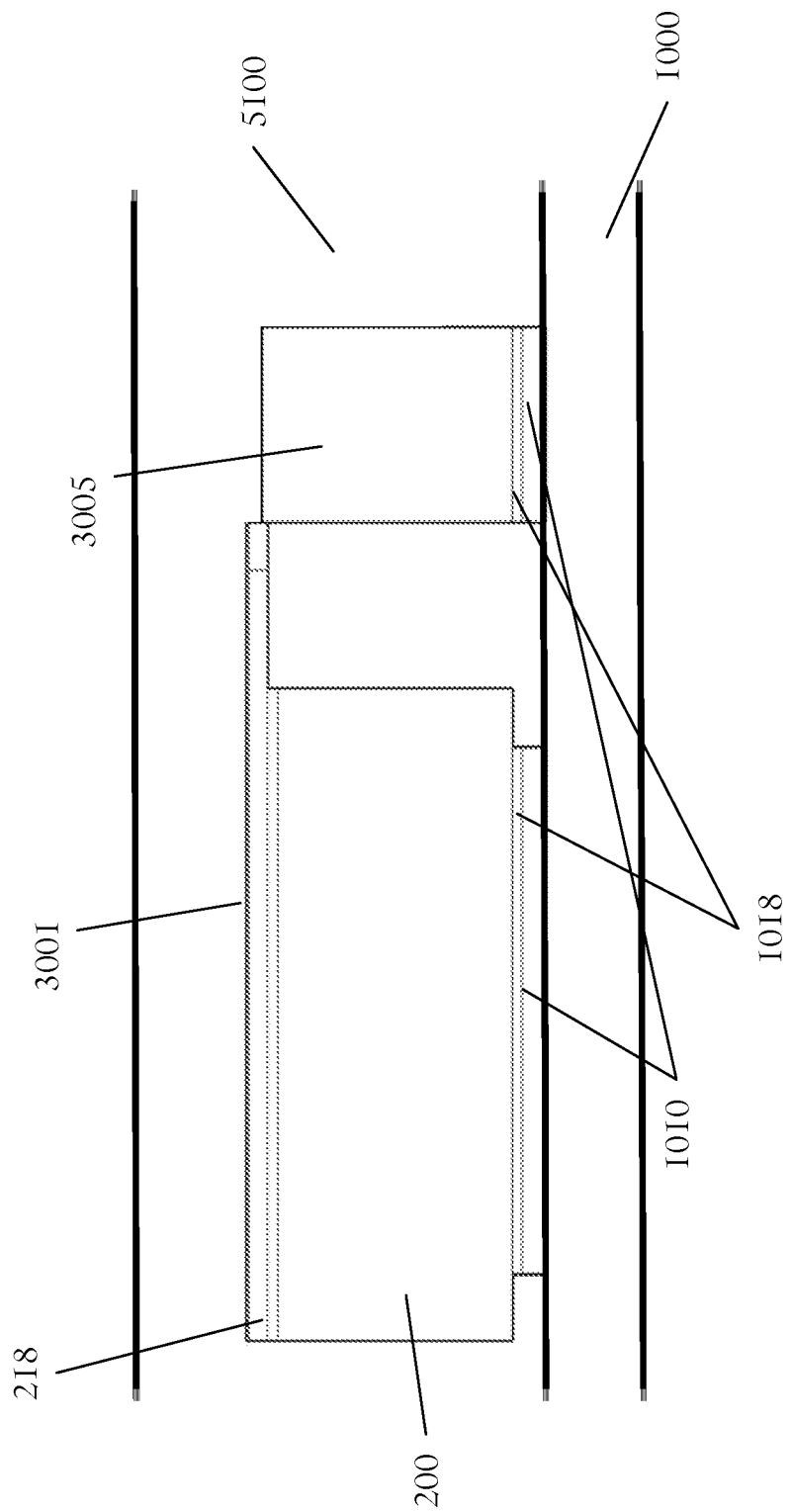
FIG. 5A schematically illustrates a cross-sectional view of the unit body of the component cut along the aa' line shown in FIG. 3B but complete with hermetic sealing structure for the component.
Figure 5B:
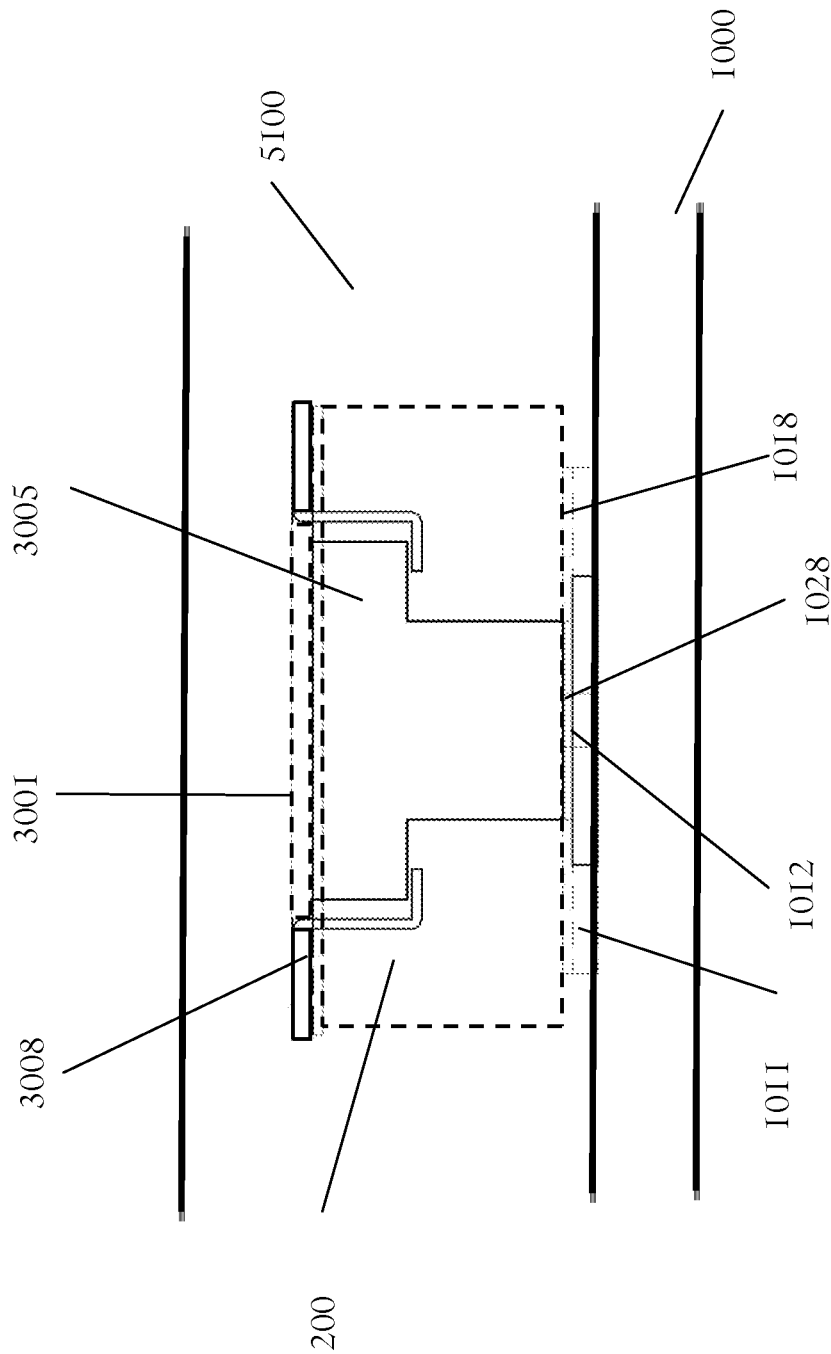
FIG. 5B schematically illustrates a cross-sectional view of the unit body of the component cut along the bb' line shown in FIG. 3B and complete with hermetic sealing structure.
Figure 6:
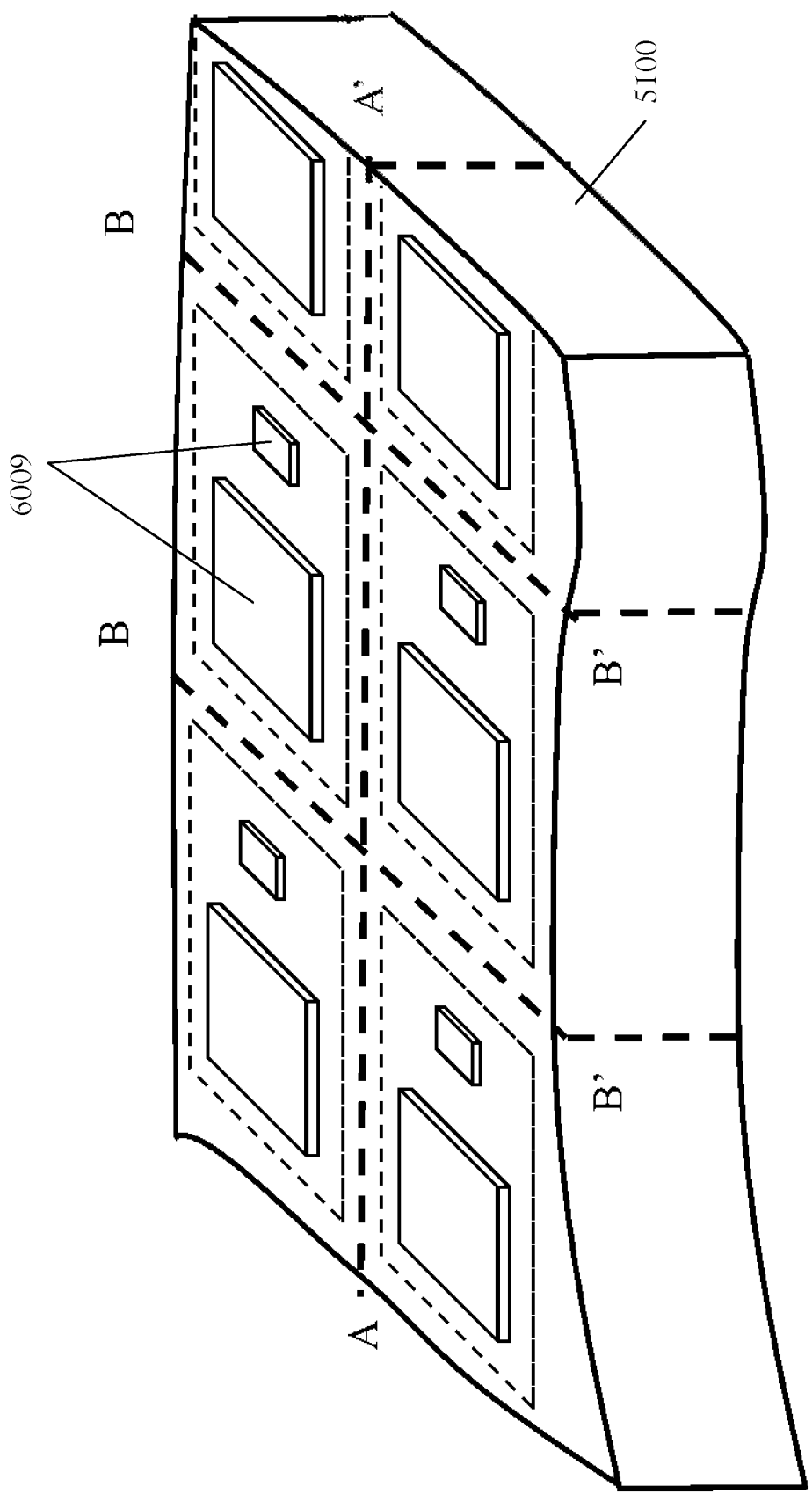
FIG. 6 schematically illustrates a partial perspective of the bottom side of a matrix of circuit components complete with their gross hermetic sealing structural body.

According to the present invention, after the robust, high-performance unit structures in FIG. 3B or 4 are formed, hermetic sealing protection can be implemented. Typically a mold is used to make such sealing by injecting a load of hot-molten resin into the mold and then allow for the resin to cool and solidify. A solidified resin hermetic sealing structure 5100 can protect the inners of the entire circuit component unit against moisture. FIG. 5A schematically illustrates a cross-sectional view of the unit body of the component cut along the aa' line shown in FIG. 3B but complete with hermetic sealing structure for the component A subtractive process can then be performed on the bottom surface of the copper substrate 1000 to separate all electrical terminals of all individual circuit components in the entire matrix. A typical subtractive procedure is, for example, a chemical etching process. FIG. 6 schematically illustrates a partial perspective of the bottom side of a matrix of circuit components complete with their gross hermetic sealing structural body. It should be noted that in FIG. 6, the circuit component having two terminals 6009 is, for example, a power diode.

Figure 7:
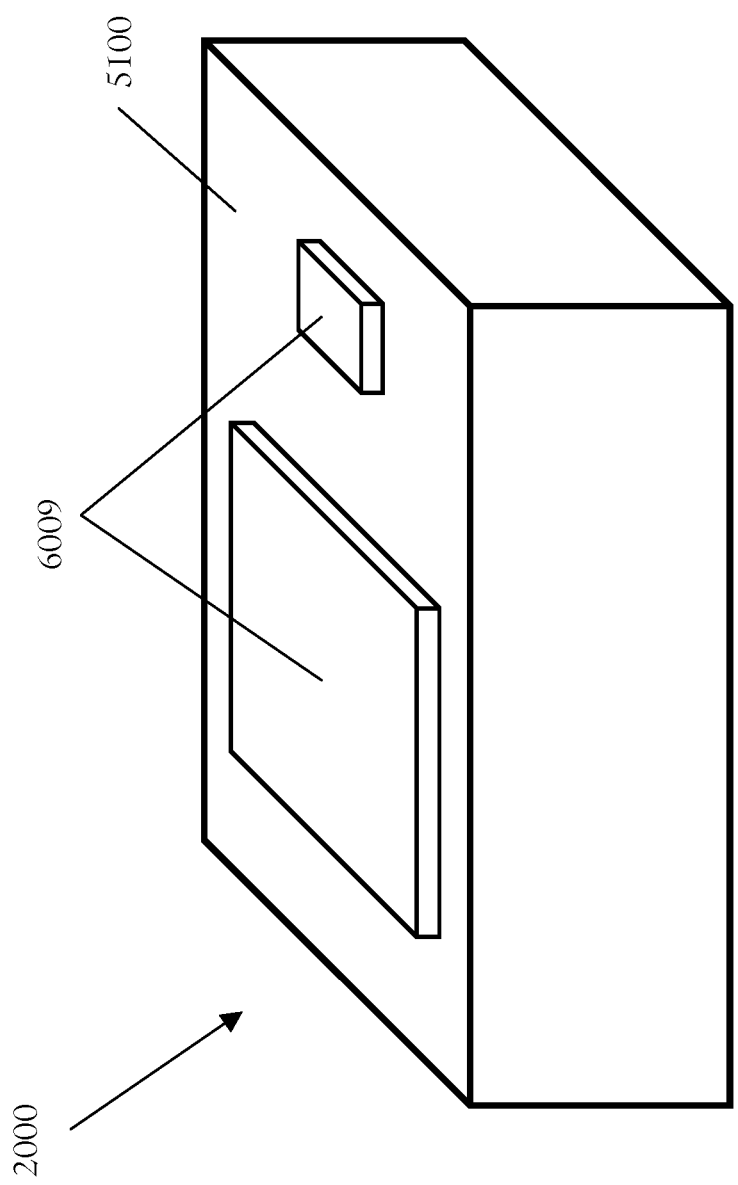
FIG. 7 schematically depicts a perspective of the bottom side of a completed circuit component fabricated out of the process according to the present invention.

Next, the entire matrix shown in FIG. 6 can be cut along lines AA' and BB' to physically separate all individual circuit components in the matrix. FIG. 7 schematically depicts a perspective of the bottom side of a completed circuit component fabricated out of the process according to the present invention.

As is generally known to a person skilled in the art, all electrical terminals of every individual circuit component shown in FIG. 7 are electrically isolated to each other, and a nickel-gold or nickel-tin plating procedure can then be performed to each terminal.

Again as is generally known to a person skilled in the art, the circuit component fabricated by the process of the present invention can be a discrete circuit component having two, three or more electrical terminals. The circuit component can be a diode, a transistor, or an optical coupling switch. Alternatively, the circuit component can also be an integrated circuit component having at least four electrical terminals.

While the invention has been described by way of example and in terms of the embodiments, it is to be understood that the invention is not limited thereto. Modifications and similar arrangements and procedures can be made by a person skilled in the art without departing from the spirit and scope of the present invention. Therefore, the scope of the appended claims should be accorded with the broadest interpretation so as to encompass all such modifications and similar arrangements and procedures.

Which is claimed is:

1. A process for batch fabrication of circuit components simultaneously packaging multiple circuit component dice in a matrix, each die having at least two electrodes with one on a top surface and the others on a bottom surface, and each die electrode being electrically connected to a corresponding electrical terminal of the circuit component it is packaged in, the process comprising the steps of:

for each circuit component in the matrix, forming on a copper substrate a preparative electrical terminal for each of the corresponding electrodes of its die;

for each circuit component in the matrix, pick-and-placing a circuit component die onto the copper substrate so that each electrode on the die bottom surface lands on its corresponding preparative electrical terminal;

for each circuit component in the matrix, pick-and-placing a horizontal conductor plate horizontally on top of the circuit component die so that a bottom surface of one end of the horizontal conductor plate lands on the top electrode of the die, the horizontal conductor plate having an opening at the end opposite where it lands on the die, and the opening having at least one vertical conductive surface;

for each circuit component in the matrix, pick-and-placing a vertical conductor block into the opening of the horizontal conductor plate so that a bottom surface of the vertical conductor block lands on the preparative electrical terminal for the top electrode of the die, and the at least one vertical conductive surface of the opening facing the top end side surface of the vertical conductor block; and for all circuit components in the matrix, performing a thermal reflow to simultaneously melt a soldering material pre-applied to the surface of each preparative electrical terminal of the copper substrate, the surface of the top electrode of the die, and the vertical conductive surface of the opening in the horizontal conductor plate, so that the circuit component die and the vertical conductor block are soldered to the copper substrate below and the horizontal conductor plate above.

2. The process of claim 1 wherein the opening in the horizontal conductor plate is an opening having a full circumference.

3. The process of claim 1 wherein the opening in the horizontal conductor plate is an opening having incomplete circumference.

4. The process of claim 1, further comprising the following steps after the thermal reflow:

forming a hermetic sealing structure for protectively encapsulating the circuit component dice, the vertical conductor blocks, and the horizontal conductor plates that are soldered firmly on the copper substrate in the matrix;

performing a subtractive processing to an opposite bottom surface of the copper substrate to electrically isolate individual electrical terminals of all circuit components in the matrix; and cutting into the hermetic sealing structure to physically separate all individual circuit components in the matrix.

5. The process of claim 4, further comprising the following step after the subtractive processing:
- nickel-gold or nickel-tin plating the surface of each and every electrical terminal.

6. The process of claim 1 wherein the circuit component is a discrete circuit component having two, three or more electrical terminals.

7. The process of claim 6 wherein the circuit component is a diode.

8. The process of claim 6 wherein the circuit component is a transistor.

9. The process of claim 6 wherein the circuit component is an optical coupler switch.

10. The process of claim 1 wherein the circuit component is an integrated circuit component having at least four electrical terminals.

11. A process for batch fabrication of circuit components simultaneously packaging multiple circuit component dice in a matrix, each die having at least two electrodes with one on a top surface and the others on a bottom surface, and each die electrode being electrically connected to a corresponding electrical terminal of the circuit component it is packaged in, the process comprising the steps of:
- for each circuit component in the matrix, forming on a copper substrate a preparative electrical terminal for each of the corresponding electrodes of its die;
- for each circuit component in the matrix, pick-and-placing a circuit component die onto the copper substrate so that each electrode on the die bottom surface lands on its corresponding preparative electrical terminal;
- for each circuit component in the matrix, pick-and-placing a vertical conductor block so that a bottom surface of the vertical conductor block lands on the preparative electrical terminal for the top electrode of the die;
- for each circuit component in the matrix, pick-and-placing a horizontal conductor plate horizontally on top of the circuit component die and the vertical conductor block so that a bottom surface of one end of the horizontal conductor plate lands on the top electrode of the die, and a bottom surface of the other end of the horizontal conductor plates lands on a top surface of the vertical conductor block;
- for all circuit components in the matrix, performing a thermal reflow to simultaneously melt a soldering material pre-applied to the surface of each preparative electrical terminal of the copper substrate, the surface of the top electrode of the die, and the top surface of the vertical conductor block, so that the circuit component die and the vertical conductor block are soldered to the copper substrate below and the horizontal conductor plate above.

12. The process of claim 11, further comprising the following steps after the thermal reflow:
- forming a hermetic sealing structure for protectively encapsulating the circuit component dice, the vertical conductor blocks, and the horizontal conductor plates that are soldered firmly on the copper substrate in the matrix;
- performing a subtractive processing to an opposite bottom surface of the copper substrate to electrically isolate individual electrical terminals of all circuit components in the matrix; and
- cutting into the hermetic sealing structure to physically separate all individual circuit components in the matrix.

13. The process of claim 12, further comprising the following step after the subtractive processing:
- nickel-gold or nickel-tin plating the surface of each and every electrical terminal.

14. The process of claim 11 wherein the circuit component is a discrete circuit component having two, three or more electrical terminals.

15. The process of claim 14 wherein the circuit component is a diode.

16. The process of claim 14 wherein the circuit component is a transistor.

17. The process of claim 14 wherein the circuit component is an optical coupler switch.

18. The process of claim 11 wherein the circuit component is an integrated circuit component having at least four electrical terminals.

* * * * *